(12) United States Patent
Fronk

(10) Patent No.: US 7,025,604 B2
(45) Date of Patent: Apr. 11, 2006

(54) HIGH CURRENT OUTPUT PIN

(75) Inventor: Karl T. Fronk, Derry, NH (US)

(73) Assignee: Astec International Limited, (HK)

( * ) Notice: Subject to any disclaimer, the term of this patent is extended or adjusted under 35 U.S.C. 154(b) by 0 days.

(21) Appl. No.: 10/404,877

(22) Filed: Mar. 31, 2003

(65) Prior Publication Data

US 2004/0192084 A1 Sep. 30, 2004

(51) Int. Cl.
*H01R 12/00* (2006.01)
(52) U.S. Cl. ...................................................... 439/75
(58) Field of Classification Search ............... 439/66, 439/74, 75, 82; 361/772, 773, 774, 790, 361/803, 785
See application file for complete search history.

(56) References Cited

U.S. PATENT DOCUMENTS

| 4,246,627 A * | 1/1981 | Poensgen .................. 361/773 |
| 5,281,149 A * | 1/1994 | Petri ............................ 439/66 |
| 5,410,452 A * | 4/1995 | Sinclair et al. ............. 361/791 |
| 6,179,631 B1 * | 1/2001 | Downes et al. .............. 439/83 |
| 2001/0030882 A1 | 10/2001 | Pitzele | |

* cited by examiner

*Primary Examiner*—Ross Gushi
(74) *Attorney, Agent, or Firm*—Nixon Peabody LLP

(57) ABSTRACT

The present invention provides a terminal pin for connecting a DC—DC power converter module or the like to a PCB. The pin has improved current carrying capabilities by having a diameter over most of its length that is larger than the ends that are connected to either the module or PCB. The larger diameter also provides for improved heat flow from the power converter module to the PCB. A smaller diameter portion near the PCB board provides for improved flow of solder between the pin and the PCB. A stand-off member is also provided to maintain the module and PCB at a predetermined stand-off distance.

9 Claims, 3 Drawing Sheets

HIGH CURRENT OUTPUT PIN

FIELD OF THE INVENTION

The present invention relates to pins for connecting one printed circuit board to another and, in particular, a pin having improved current carrying and heat transfer capabilities.

BACKGROUND OF THE INVENTION

Electronic equipment is often assembled from subassemblies of electronic components on printed circuit boards (PCBs) that receive power and communicate through a common bus. In some implementations of this architecture, power is delivered through a bus to individual boards at a voltage that is directly usable by the loads on those boards. Recent trends in electronic equipment architecture include the use of higher voltage buses in conjunction with DC—DC power conversion at the board level. Thus, for example, a bus operating at 48 volts delivers power to an on-board power converter having a lower output voltage, such as 3.5 volts, for use by devices on that board. The implementation of an architecture having a higher voltage bus is facilitated by the use of preassembled DC—DC power conversion modules (power modules) that are adapted for mounting on a PCB, and have pins to provide electrical connections between a module and a PCB.

Power modules are commonly mounted parallel to a PCB at a predetermined stand-off distance to accommodate PCB and power module components and to allow for cooling air to flow around heat generating components. Connecting terminal pins typically span the stand-off distance between the power module and PCB, and usually protrude through holes in the power module and PCB, where electrical connections are made. In addition to providing the proper electrical connections, the mounting of power conversion modules on PCBs must also provide for the physical support of the power module on the PCB, and this support structure should not impede the cooling of heat dissipating components on the power module or the PCB. Due to the weight of the power module and the small diameter of standard terminal pins, some provision is also usually made to physically support the combined power module/PCB structure.

One prior art system for connecting power modules with PCBs is illustrated in FIGS. 1 and 2. FIG. 1 is a perspective view of a power conversion module 110 having a plurality of pins 100, and FIG. 2 is a sectional view of the power module 110 and pins 100 as mounted on a PCB 120. Power module 110 includes a board 111 having a first side 113 with electronic components C, a second side 115, and a plurality of holes 112 through the module. Each of the plurality of pins 100 passes through one of holes 112 and is electrically connected to conductive traces (not shown) on board 111. Specifically, holes 112 are adjacent to conductive traces on board 111, with electrical connections between board 111 and pins 100 provided typically by solder 131. In general, conductive traces may be present on either side of board 111, and/or in interior layers of board 111, and thus pins 100 may be soldered on one or both sides of board 111, as required.

Typically, a PCB having power requirements is configured for accepting a particular power module 110 including terminal pins 100. PCB 120 has a first side 121 and a second side 123, and a plurality of holes 125 positioned in a predetermined conventional fashion with respect to conductive traces (not shown). Holes 125 are positioned to accept pins 100 according to the position and required voltages at each one of holes 125. Thus, PCB 120 is configured to accept module 110 by having holes 125 that match the pattern of holes 112, and by having conductive traces on the PCB that can accept and provide the appropriate signals through pins 100. With pins 100 placed through holes 125, electrical connections are made using solder as shown at 133. Pins 100 have a length sufficient to allow module 110 and PCB 120 to have a stand-off distance S as shown in FIG. 2. The plurality of pins 100 thus span the stand-off distance S, protrude through mounting holes 112 and 125, and are electrically attached to the conductive traces by solder 131 and 133.

Pins 100 are long, cylindrical members, and as such do not provide sufficient physical support to the combined power module 110 and PCB 120 structure to prevent movement of the assembled components. To provide a more rigid structure, surface mounted supports 117 having a height S for connecting second side 115 of module 110 and first side 121 of PCB 120 are provided, as shown in FIGS. 1 and 2. Supports 117 can be tubular or boxlike structures, preferably of metal, as shown in FIGS. 1 and 2, or can be solid stand-off supports. The addition of several supports 117 provides support to maintain module 110 and PCB 120 at the predefined stand-off distance S, as well as provide rigidity to prevent the power module and PCB from moving relative to one another, for example, as might occur as a result of movement of the electronic equipment in which they are assembled. While the prior art device of FIGS. 1 and 2 can provide the required electrical connections and physical support for module 110 and PCB 120, there are several drawbacks. One drawback is that supports 117 must be fabricated and attached to module 110 and PCB 120. This adds to the complexity and cost of the assembly. Another drawback is that supports 117 occupy valuable surface area on the respective assemblies. In addition, the current carrying capability of pins 100 is limited by pin diameter, which is the diameter of holes 112 and 125.

FIG. 3 shows another prior art device that attempts to overcome some of the previously noted deficiencies by combining the electrical and mechanical functions of the pin and support structures into a prior art pin 300. Specifically, FIG. 3 shows a sectional view of prior art terminal pin 300 adapted for connecting a module 310 to a PCB 320. Module 310 has a board 311 with a first side 315 and holes 312. PCB 320 has holes 325 and an opposing side 321 at a stand-off distance S. Each pin 300 has a first end 301, a second end 303, and a central portion 305 with a first flange 307 and a second flange 309. The flanges 307 and 309 abut surfaces 315 and 321, respectively, providing structural support for maintaining module 310 and PCB 320 at the predetermined stand-off distance S. Similar to the prior art pin of FIGS. 1 and 2, module 310 includes pins 300, and the module and pin combination is attached to PCB 320 using solder. Board 311 and PCB 320 have electrical traces (not shown) adjacent to holes 312 and 325, respectively, as in the prior art device of FIGS. 1 and 2. Electrical contacts between pins 300 and module 310 and PCB 320 are provided by solder 331 and 333. The distance between flanges 307 and 309 is equal to the stand-off distance S, and thus each pin 300 provides both an electrical connection between module 310 and PCB 320 and physical support to both the module and PCB. Module 310 and PCB 320 can be assembled with pins 300 alone, or by the combination of pins and supports, such as supports 117.

While each pin 300 provides an electrical connection as well as physical support, this pin makes it difficult to provide adequate electrical contact between the module 310 and PCB 320. Thus, for example, there is a close fit between each of the pins 300 and the corresponding hole 325 and between the flange 309 and the surface of module 310. As a result, during the soldering step, the flow of solder 331 and 333 between each pin and the PCB is hindered, and thus it is difficult to provide a good electrical connection between the pins 300 and the PCB.

What is needed is an improved pin for mounting a module to a PCB that provides electrical and physical support. Specifically, there is a need for pins having reduced electrical and thermal resistance. There is also a need for pins that provide increased bending resistance to increase the rigidity of connected components, and a need to provide for improved soldering capabilities. Such a pin should be compatible with standard PCB assembly techniques.

SUMMARY OF THE INVENTION

The present invention solves the above-identified problems of known terminal pins for connecting power converters or other modules to PCBs. In particular, the present invention provides a pin that has improved current carrying and thermal transport capabilities. The present invention also provides a pin having improved strength to resist bending and which provides improved soldering capabilities.

It is one aspect of the present invention to provide a terminal pin for connecting a first board to a second board, where the first board is substantially parallel to the second board, and where opposing surfaces of the first board and the second board are spaced by a stand-off distance. The terminal pin includes a first end having a first diameter adapted for insertion to a hole in said the board, a second end having a second diameter adapted for insertion to a hole in the second board, and an elongated portion between the first end and the second end. The elongated portion has a transverse dimension that is greater than either the first diameter or the second diameter. The elongated portion has a length that is a substantial portion of the stand-off distance and is less than the stand-off distance. In one embodiment, the elongated portion has a surface at the portion nearest the second end that is perpendicular to the pin and further includes a transition portion between the surface and the second end. In another embodiment, the first end is knurled. In yet another embodiment, the elongated portion includes a flange at the first end.

The present invention solves the above-identified problems of known modules by providing an improved pin for connecting the module to a PCB. In particular, the present invention provides a module having a pin that has improved current carrying and thermal transport capabilities without having the pin provide the mechanical structure that determines the stand-off distance between the module and the PCB. The present invention also provides a module having a pin having improved strength to resist bending and improved soldering capabilities.

It is another aspect of the present invention to provide a pin for connecting a DC—DC power converter module to a PCB that provides for greater current carrying capabilities over prior art pins.

It is another aspect of the present invention to provide a terminal pin having a lower electrical resistance between two connected boards.

It is one aspect of the present invention to provide a terminal pin that has a lower thermal resistance between two connected boards.

It is yet another aspect of the present invention to provide a terminal pin that has reduced electrical resistance and can be soldered to a PCB board It is an aspect of the present invention to provide a terminal pin that is effective, compatible with printed circuit board assembly techniques, and is less expensive than prior art terminal pins.

It is another aspect of the present invention to provide a module mounted at a stand-off distance from a printed circuit board. The module includes a board having electrical components mounted thereon, an element protruding from the board for supporting the printed circuit board and said module at the stand-off distance, and a plurality of pins each in electrical contact with at least one of the electrical components and protruding away from the board. Each of the plurality of pins includes an end having a first diameter adapted for insertion into a respective hole in said printed circuit board, and an elongated portion having a length extending from the board towards the end, where the length is less than the stand-off distance, and having a diameter greater than the first diameter. In one embodiment, the elongated portion has a surface at the portion nearest the end that is perpendicular to the pin, and further includes a transition portion between the surface and the end. The longitudinal distance between the first end and the second end is greater than the stand-off distance. In another embodiment, the end is knurled. In yet another embodiment, the elongated portion includes a flange at said first end.

It is yet another aspect of the present invention to provide a DC—DC power converter module having a pin for connecting said power module to a PCB that provides for greater current carrying capabilities over prior art pins.

It is another aspect of the present invention to provide a DC—DC power converter module having a terminal pin having a lower electrical resistance between the power module and a connected PCB.

It is one aspect of the present invention to provide a DC—DC power converter module having a terminal pin that has a lower thermal resistance between the power module and a connected PCB.

It is yet another aspect of the present invention to provide a DC—DC power converter module having a terminal pin that has reduced electrical resistance and can be soldered to a PCB board A further understanding of the invention can be had from the detailed discussion of the specific embodiment below. For purposes of clarity, this discussion refers to devices, methods, and concepts in terms of specific examples. It is intended that the invention is not limited by the discussion of specific embodiments.

BRIEF DESCRIPTION OF THE DRAWING

The foregoing aspects and the attendant advantages of the present invention will become more readily appreciated by reference to the following detailed description, when taken in conjunction with the accompanying drawings, wherein.

Reference symbols are used in the Figures to indicate certain components, aspects or features shown therein, with reference symbols common to more than one Figure indicating like components, aspects or features shown therein.

DETAILED DESCRIPTION OF THE INVENTION

To facilitate its description, the invention is described below in terms of pins for mounting a DC—DC power converter to a PCB. In general, the present invention provides an apparatus for connecting two printed circuit boards in approximate parallel configuration.

Figure 1:
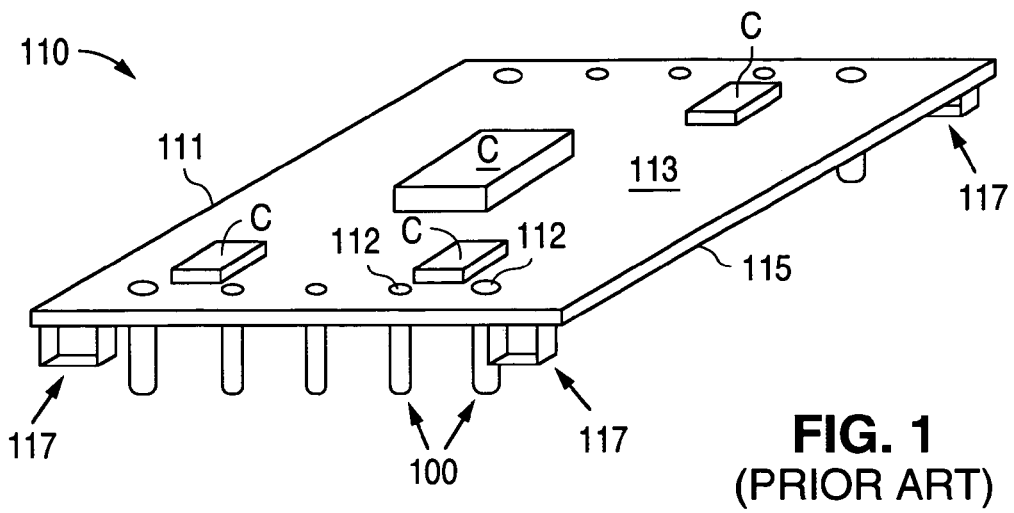
FIG. 1 is a perspective view of a prior art module and pins for mounting on a PCB.
Figure 2:
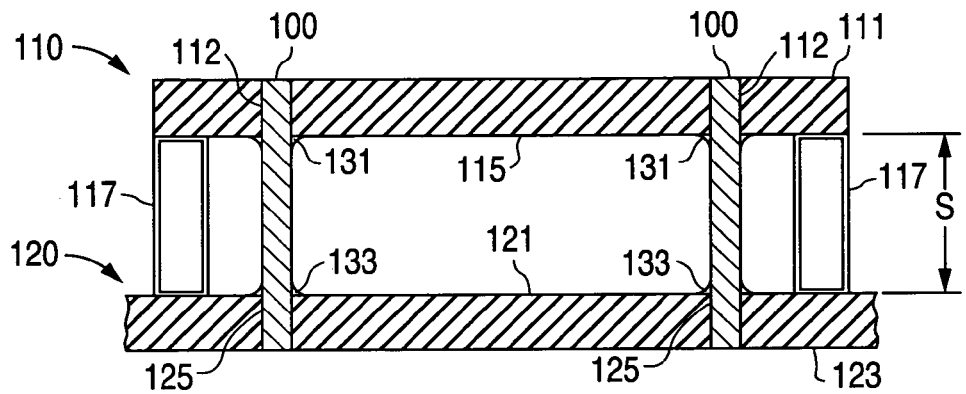
FIG. 2 is a sectional view of the prior art module of FIG. 1 as mounted on a PCB.
Figure 3:
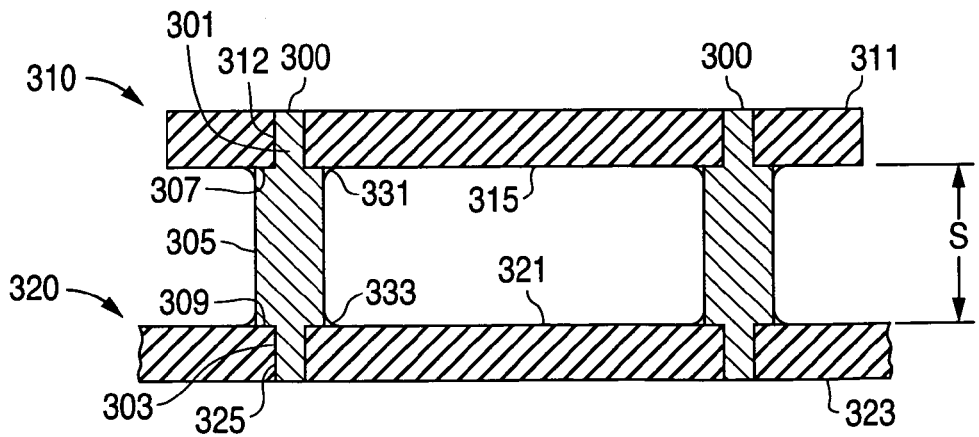
FIG. 3 is a sectional view of another prior art module as mounted on a PCB.
Figure 4:
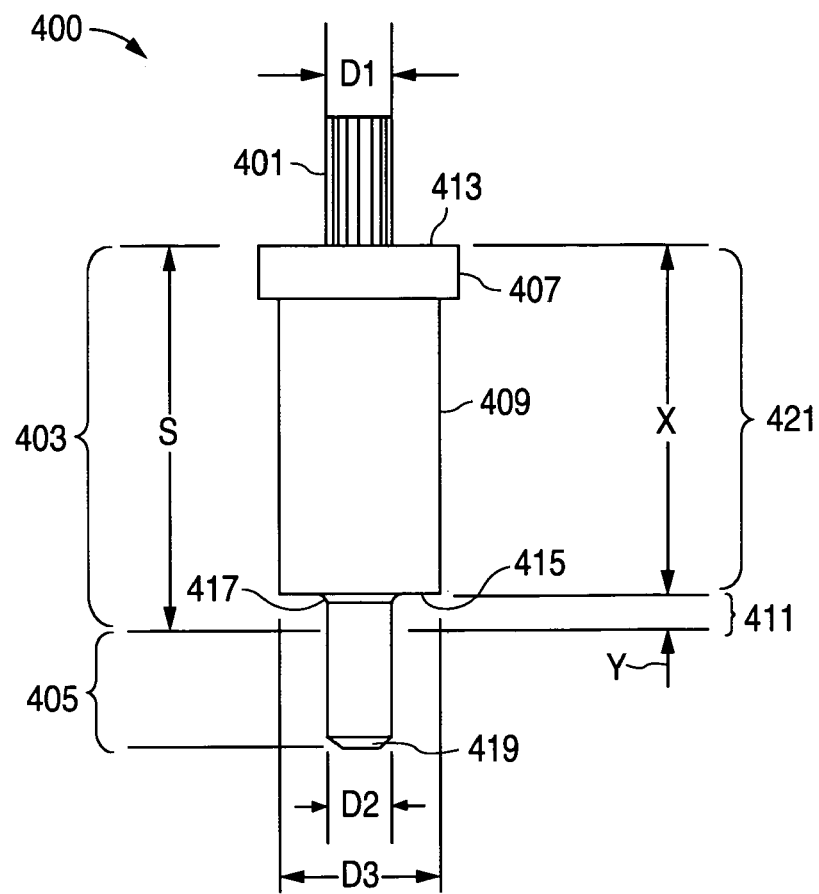
FIG. 4 is a side view of a terminal pin according to the present invention.
Figure 5:
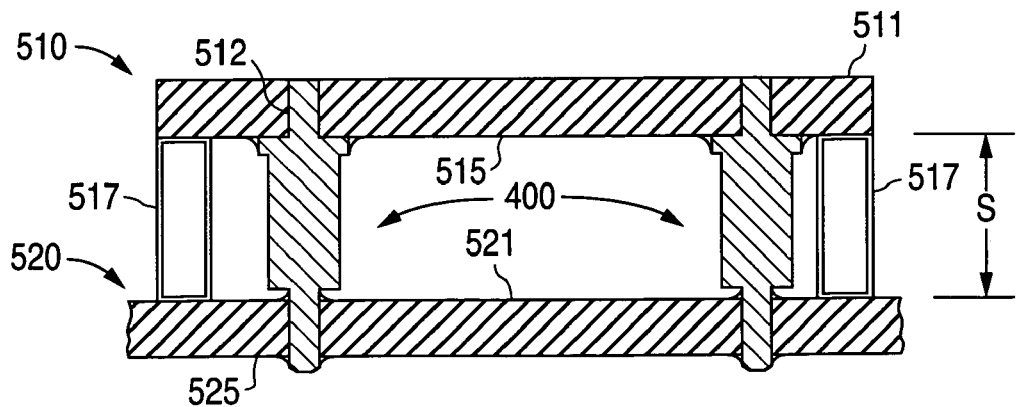
FIG. 5 is a sectional view of a module connected to a PCB using the terminal pin of FIG. 4.
Figure 6:
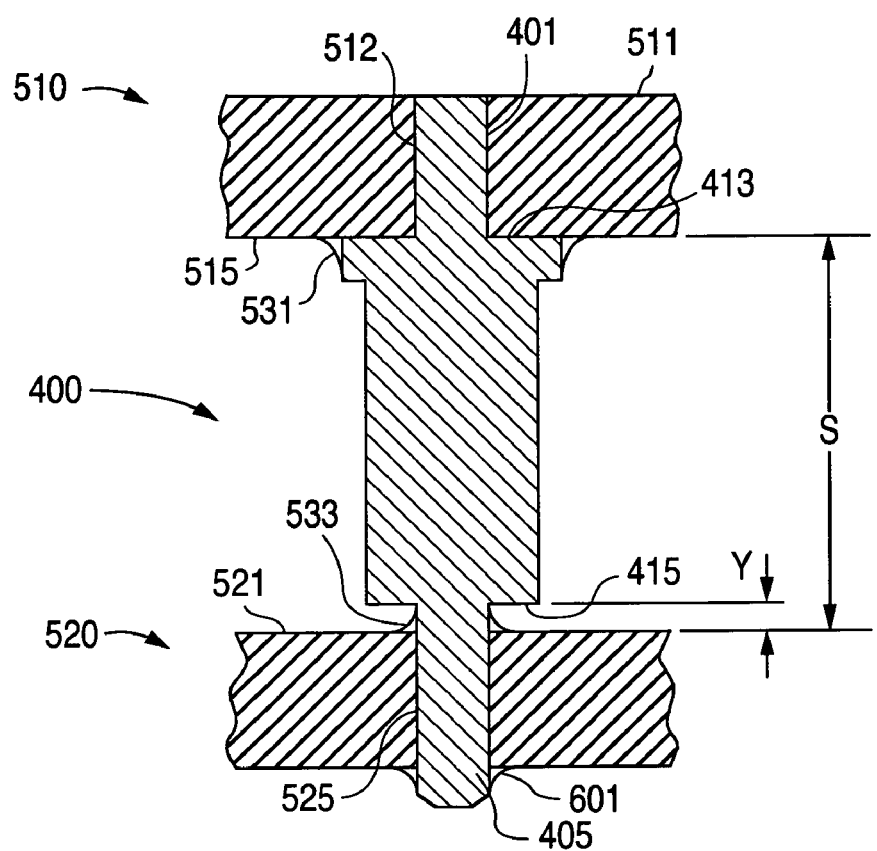
FIG. 6 is a detailed section view of the terminal pin, module, and PCB of FIG. 5.

The present invention will now be described in more detail with reference to the Figures. Specifically, FIG. 4 is a side view of a terminal pin 400 according to the present invention, FIG. 5 is a sectional view of a module 510 having a board 511 connected to a PCB 520 using terminal pin 400 at a stand-off distance S, and FIG. 6 is a detailed section view of the terminal pin, module and PCB of FIG. 5. As shown in FIG. 4, pin 400 has an elongated shape with a first end 401, an elongated portion 403, and a second end 405. Pin 400 provides electrical conductivity between module 510 and PCB 520, and is preferably a metal having a high electrical conductivity, such as brass or some other material known in the art for use as terminal pins. As shown in FIGS. 5 and 6, ends 401 and 405 are adapted for mounting in circuit boards having a stand-off distance S with elongated portion 403 spanning the stand-off distance. First end 401 is a cylindrical portion having a knurled surface and a diameter D1. Second end 405 has a diameter D2 and terminates at taper 419.

Elongated portion 403 includes a first portion 421 having a length X, and a second portion 411 having a length Y. First portion 421 extends from a first surface 413 adjacent to first end 401 and a second surface 415 a distance X from the first surface. The distance X is less than but is a substantial portion of the stand-off distance S. A substantial part of first portion 421 has a diameter D3 that is greater than the diameters of either end (D1 or D2). First portion also includes a flange 407 near first end 401 and can include a fillet 417 adjacent to second surface 415.

An assembled module 510 and PCB 520 is shown in FIG. 5. Module 510 includes a board 511 having holes 512 adjacent to conductive traces (not shown) on a surface 515 that faces PCB 520 of the module/PCB assembly. PCB 520 includes holes 525 adjacent to conductive traces (not shown) on a surface 521 that faces module 510. Pins 400 and one or more members 517 span the stand-off distance S between surface 515 and 521. As described below, members 517 provide mechanical support of module 510, while pins 400 provide electrical and thermal contact between the module and PCB 520.

The connection of module 510 with PCB 520 is best illustrated in FIG. 6. End 401 of pin 400 is adapted to fit through hole 512, with surface 413 flush against surface 515. The knurled finish of end 401 improves the strength of the pin/module connection. Preferably the diameter D1 is slightly greater than the diameter of hole 512 so that end 401 provides a good press fit into board 511. Electrical contact between pin 400 and the module 510, and specifically between surface 413 and 515, is provided by solder 531 that is applied by a standard flow soldering technique. Flange 407 thus provides added surface contact for the electrical connection to board 511, and thereby also adds to the rigidity of the mechanical connection between pin 400 and module 510.

It is preferred that module 510, including pins 400, are provided for connection to PCB 520. To facilitate connection of the boards, second end 405 has a diameter D2 that allows the second end to easily fit through a hole 525 in PCB 520, as aided by taper 419. The electrical connection between PCB 520 and pin 400 is provided by solder 533 that contacts second portion 411 and a conducting layer (not shown) on surface 521 that is adjacent to hole 525. Importantly, second end 405 extends beyond second surface 415 so that the second surface is close to, but does not contact, surface 521, allowing solder to easily flow between pin 400 and board 520. Preferably, second end 405 protrudes through board 520, allowing for a solder fillet 601 to secure the attachment of pin 400 on both sides of board 520.

The stand-off distance is maintained by members 517, which are surface mounted to surfaces 515 and 521. In general, member 517 can be a tubular member, a solid member, or can be formed as part of a housing or board holding member having slots or stand-offs to maintain the separation S. Members such as member 517 can be held in place using adhesive, solder, by use of fasteners or otherwise as is known in the art.

Pin 400 thus has a diameter that is greater than the diameters of ends 401 and 405 for a substantial portion of stand-off distance S. This increased diameter provides a cross-sectional area for current flow that is larger than the cross-sectional area of either one of ends 401 or 405. As a result of the increased cross-sectional area, pin 400 has a lower electrical resistance, and thus will have less resistance heating than a constant diameter pin through holes 512 and 525. In addition, the thermal resistance along the pin is also reduced, allowing for greater flow of heat from module 510. The increased diameter D3 of pin 400 also provides greater bending strength than does a constant diameter pin having a diameter of the hole diameters, while the spacing between boards 511 and 520 are maintained by members 517.

In one exemplary example, the diameter of holes 512 and 525 are 0.082", and the stand-off distance S is 0.21". Length X of pin 400 is 0.170", leaving a distance Y of approximately 0.040" for soldering pin 400 to PCB 520. Diameter D1 is 0.085", allowing the knurled, first end 401 to be press fit into hole 512, and diameter D2 is 0.080", allowing second end 405 to be placed through hole 525. The diameter D3 is 0.180", providing a substantial cross-sectional area increase over the cross-sectional areas of either the first end or the second end. This increased cross-sectional area results in a decreased electrical and thermal resistance along the length of pin 400 and an improved resistance to bending. The distance Y is sufficient to allow for solder to flow between pin 400 and PCB 520 and provide for electrical contact between the pin and PCB.

The invention has now been explained with regard to specific embodiments. Variations on these embodiments and other embodiments may be apparent to those of skill in the art. It is therefore intended that the invention not be limited by the discussion of specific embodiments. It is understood that the examples and embodiments described herein are for illustrative purposes only and that various modifications or changes in light thereof will be suggested to persons skilled in the art and are to be included within the spirit and purview of this application and scope of the appended claims

What is claimed is:

1. An apparatus for electrically connecting first and second printed circuit boards in an approximate parallel configuration at a stand-off distance comprising:
   at least one element positioned between each said printed circuit board for supporting said printed circuit boards at said stand-off distance; and
   a plurality of pins where each of said plurality of pins includes an electrically conductive first end having a first diameter adapted for insertion into a respective hole in said first printed circuit board, an electrically conductive second end having a second diameter adapted for insertion into a respective hole in said second printed circuit board; and a first portion having a length extending from said first board towards said second board, where said length is less than said stand-off distance, and having a diameter greater than said first diameter, said first portion extending from a first surface having said first end extending therefrom to a second surface having said second end extending therefrom,
   said first surface is adapted for abutting said first board when said first end is inserted into said hole of said first board, such that when said first surface is abutting said first board and said second board is positioned at said stand-off distance from said first board and said second end is inserted into said second board, a portion of said second end of a length equal to the stand-off distance less the length of said first portion extends above said second board so as to create a gap between said second surface of said first portion and said opposing surface of said second board, said gap equal to the stand-off distance less the length of said first portion.

2. The module of claim 1, wherein the length of each said pin, including said first end and said second end is greater than said stand-off distance.

3. The module of claim 1, wherein each said first end is knurled.

4. The module of claim 1, where each said first portion includes a flange adjacent said first end.

5. The module of claim 1, where said module is a DC—DC converter module.

6. A method for mounting a module to a printed circuit board such that they are separated by a stand-off distance S, comprising the steps of:
   mounting at least one terminal pin to said module, each said terminal pin including a first end having a first diameter sized for insertion into a corresponding hole in said module, a second end having a second diameter sized for insertion to a corresponding hole in said printed circuit board, and a first portion between said first end and said second end, where said first portion has a transverse dimension that is greater than either said first diameter or said second diameter, and where said first portion has a length that is a substantial portion of said stand-off distance S and is less than said stand-off distance S;
   positioning one or more stand-off members having a height S between said module and said printed circuit board such that each said stand-off member is in contact with opposing surfaces of said module and said printed circuit board to provide said stand-off distance,
   extending the second end of each said terminal pin into its corresponding hole in said printed circuit board;
   such that a portion of said second end of a length equal to the stand-off distance less the length of said first portion extends above said printed circuit board so as to create a gap between said first portion and said printed circuit board, said gap equal to the stand-off distance provided by said stand-off members less the length of said first portion; and
   soldering said second end to the surface of said printed circuit board.

7. The method of claim 6, wherein said module is a DC—DC converter.

8. The method of claim 6, wherein said first portion includes a flange adjacent said first end, and wherein said method further comprises the step of soldering said flange to the surface of said module.

9. The method of claim 6, wherein said second end extends through the width of said printed circuit board, and wherein said method further comprises the step of soldering said second end to both the opposing surface of said printed circuit board and its opposite surface.

* * * * *